United States Patent

Su et al.

Patent Number: 6,093,626
Date of Patent: *Jul. 25, 2000

[54] BURIED CONTACT METHOD TO RELEASE PLASMA-INCLUDED CHARGING DAMAGE ON DEVICE

[75] Inventors: Kuan-Cheng Su, Taipei; Shing-Ren Sheu, Tao-Yuan, both of Taiwan

[73] Assignee: United Microelectronics Corp., Taiwan

[*] Notice: This patent is subject to a terminal disclaimer.

[21] Appl. No.: 08/897,229

[22] Filed: Jul. 29, 1997

Related U.S. Application Data

[63] Continuation of application No. 08/511,065, Aug. 3, 1995, Pat. No. 5,691,234.

[51] Int. Cl.[7] .................. H01L 21/331; H01L 21/26; H01L 21/22
[52] U.S. Cl. .................. 438/532; 438/392; 438/369; 438/370; 438/513; 438/564; 438/657
[58] Field of Search .................. 438/657–661, 438/558, 526, 564, 368–370, 392, 485, 495, 513, 532

[56] References Cited

U.S. PATENT DOCUMENTS

| | | | |
|---|---|---|---|
| 5,350,710 | 9/1994 | Hong et al. | 437/170 |
| 5,393,701 | 2/1995 | Ko et al. | 437/193 |
| 5,650,745 | 7/1997 | Merrill et al. | 327/379 |
| 5,691,234 | 11/1997 | Sue et al. | 437/186 |
| 5,760,445 | 6/1998 | Diaz | 257/356 |

OTHER PUBLICATIONS

Shone, et al., "Gate Oxide Charging and its Elimination for metal Capacitor and Transistor in VLSI CMOS Double Layer Metal Technology," Symposium on VLSI Technology, Jun. 1988, pp. 73–74.

S. Wolf, "Silicon Processing for the VLSI Era," vol. 2, Lattice Press, 1990, pp. 160–162.

*Primary Examiner*—Richard Booth
*Assistant Examiner*—Ha Tran Nguyen
*Attorney, Agent, or Firm*—Rabin & Champagne, PC

[57] ABSTRACT

A method for eliminating plasma-induced charging damage during manufacture of an integrated circuit is described. A semiconductor substrate having a first conductivity type is provided. An oxide layer is formed on the semiconductor substrate. An opening is formed in the oxide layer. A polysilicon layer is formed over the oxide layer and in the opening. A diffusion region is formed in the semiconductor substrate, connected to the polysilicon layer through the opening, having a second conductivity type opposite to the first conductivity type, whereby a buried contact is formed. The buried contact is connected, through the substrate, to a ground reference. Further processing in a plasma environment is performed that would normally produce charging damage to the integrated circuit, but whereby the buried contact prevents the charging damage.

10 Claims, 3 Drawing Sheets

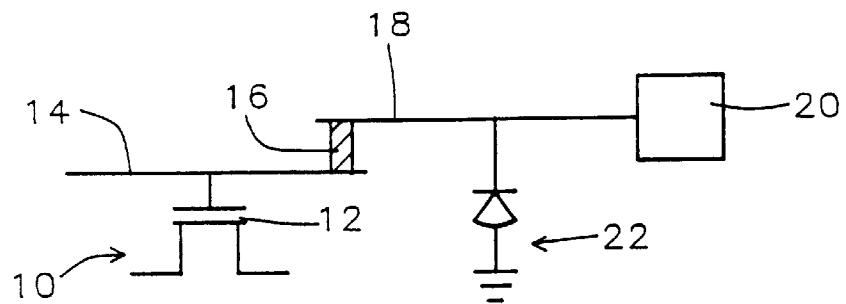
FIG. 1 – Prior Art
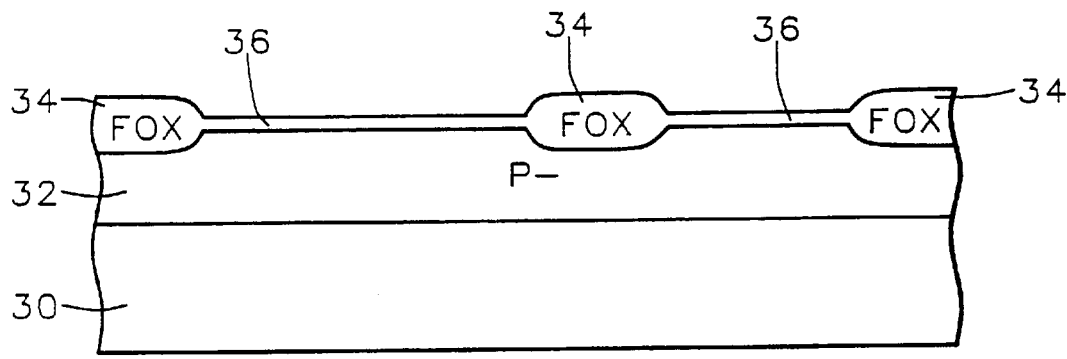
FIG. 2
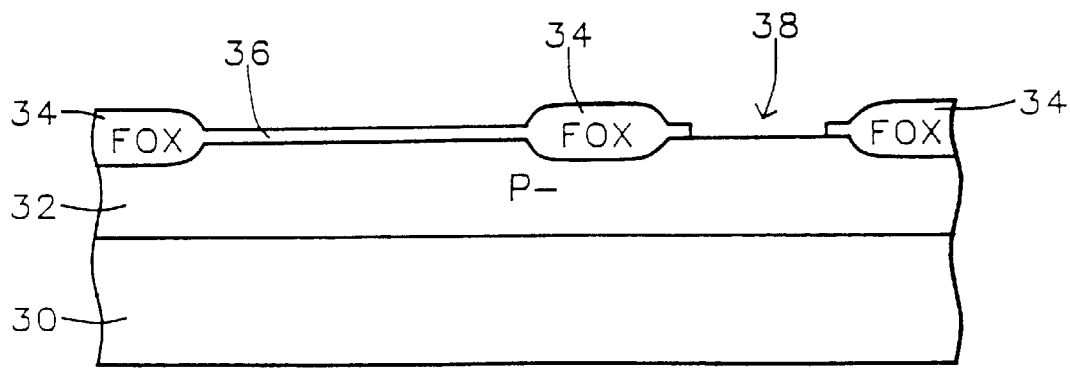
FIG. 3

6,093,626

BURIED CONTACT METHOD TO RELEASE PLASMA-INCLUDED CHARGING DAMAGE ON DEVICE

This is a continuation of application Ser. No. 08/511,065 filed on Aug. 3, 1995, now U.S. Pat. No. 5,691,234.

BACKGROUND OF THE INVENTION (1) Field of the Invention

The invention relates to the manufacture of highly dense integrated circuits, and more particularly to the reduction of electrostatic charge buildup at a Metal Oxide Semiconductor (MOS) device during manufacturing processes.

(2) Description of the Related Art

In the manufacture of highly dense integrated circuits using MOS technology, unwanted electrical charges may build up at the device gate oxide during plasma processing. The charge accumulates on floating polysilicon and metal layers electrically connected to the gate oxide. Conductive surfaces act as "antennas", amplifying this charging effect and leading to trapped charges at the gate oxide. These trapped charges can cause yield loss and reliability failures.

Workers in the field have verified this problem experimentally. Shone et al in "Gate Oxide Charging and Its Elimination for Metal Antenna Capacitor and Transistor in VLSI CMOS Double Layer Metal Technology" (published in "Symposium on VLSI Technology, pp. 73–74 in June, 1988) verified the antenna effect experimentally. They found that the double metal layer technologies worsened the effect by the ratio of the antenna area to the gate oxide area. While the worst degradation of gate oxide occurred during oxynitride deposition, other plasma processing is also believed to lead to trapped charges at the gate oxide. One suggested remedy was the attachment of a substrate diode to the metal antenna.

Others have attempted to resolve these problems. In U.S. Pat. No. 5,350,710 (Hong, et al.), an antifuse device is formed between the metal antenna and the device to be protected, in order to isolate the device during plasma processing. Later in the manufacture of the circuit, a short-circuit is formed at the antifuse by applying a sufficiently high voltage across the antifuse location, to form the final connection between the metal and device.

While the above solutions satisfactorily avoid the antenna effect during plasma processing after formation of the metal layer, they do not address the problem of plasma processing prior to metal formation, for example between formation of polysilicon layer(s) and metal formation.

SUMMARY OF THE INVENTION

It is a principal object of this invention to provide a method for eliminating plasma-induced charging damage during manufacture of an integrated circuit.

This object is achieved by providing a semiconductor substrate having a first conductivity type. An oxide layer is formed on the semiconductor substrate. An opening is formed in the oxide layer. A polysilicon layer is formed over the oxide layer and in the opening. A diffusion region is formed in the semiconductor substrate, connected to the polysilicon layer through the opening, having a second conductivity type opposite to the first conductivity type, whereby a buried contact is formed. The buried contact is connected, through the substrate, to a ground reference. Further processing in a plasma environment is performed that would normally produce charging damage to the integrated circuit, but whereby the buried contact prevents the charging damage.

BRIEF DESCRIPTION OF THE DRAWINGS

FIG. 1 is a schematic diagram of a Prior Art method for reducing plasma-induced charging damage during manufacture of an integrated circuit.

FIGS. 2 to 5 are cross-sectional diagrams of the method of the present invention of forming a buried contact to reduce plasma-induced charging damage.

FIG. 5 is taken along line 5—5.

DESCRIPTION OF THE PREFERRED EMBODIMENTS

Figure 4:
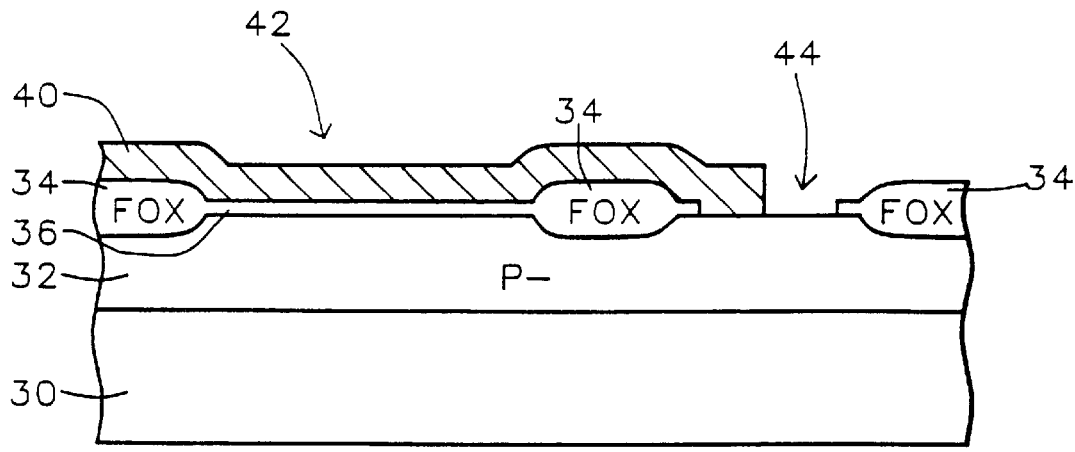

Referring now to FIG. 1, there is shown a schematic diagram to demonstrate one method from the Prior Art to address plasma-induced charging damage during fabrication of integrated circuits. After a MOS device 10 is formed having gate oxide 12 and connected to polysilicon 14, an insulating layer is formed and metal contact 16 is created. Metal interconnection line 18 is deposited and patterned and fills metal contact 16. Metal contact pad 20 may be formed at the same time. Damage to the MOS device, caused by subsequent plasma processing, is prevented due to protection diode 22 connected to the metal line 18. However, any plasma processing that takes place after formation of polysilicon 14 and before the diode is connected to metal line 18 will cause MOS damage due to charge accumulation at gate oxide 12.

It is common in the manufacture of integrated circuits today to use plasmas, with two of the most common processes being reactive plasma etching, and plasma enhanced chemical vapor deposition. A plasma is a collection of charged particles, including electrons and positive and negative ions, and it is these charged particles that collect along the conductive surfaces during plasma processing and may produce trapped charges damaging the gate oxide. The invention involves forming a buried contact connected to the polysilicon, to prevent charging damage at earlier stages of manufacture than in the Prior Art, and so to overcome the problem of the Prior Art method shown in FIG. 1.

One method of forming the buried contact structure of the invention is shown in FIGS. 2 to 6. Referring now to FIG. 2, there is shown a silicon substrate 30, with a P-well structure formed thereon by, for example, ion implanting boron at a concentration of between about 1 E 12 and 5 E 13 atoms/cm.$^2$ and an energy of between about 70 and 200 KeV. Field oxide (FOX) regions 34 are formed by any of several well known processes in the art, such as LOCOS (LOCal Oxidation of Silicon), to isolate active device regions from one another. A thin gate oxide 36 is formed by thermal oxidation, to a thickness of between about 60 and 300 Angstroms.

As shown in FIG. 3, an opening 38 is formed in oxide 36 at the location of the to-be-formed buried contact, using conventional lithography and etching. Referring now to FIG. 4, a polysilicon layer is conformally deposited to a thickness of between about 500 and 6000 Angstroms. This layer is doped by, for example, in-situ doping, or by ion implantation of phosphorus at a concentration of between about 1 E 15 and 5 E 16 atoms/cm.$^2$ and an energy of between about 10 and 200 KeV. The doped polysilicon is then patterned by conventional lithography and etching, to form a gate electrode for a connected MOS device in the region 42, and an opening 44 is simultaneously formed over the oxide opening.

Figure 5:
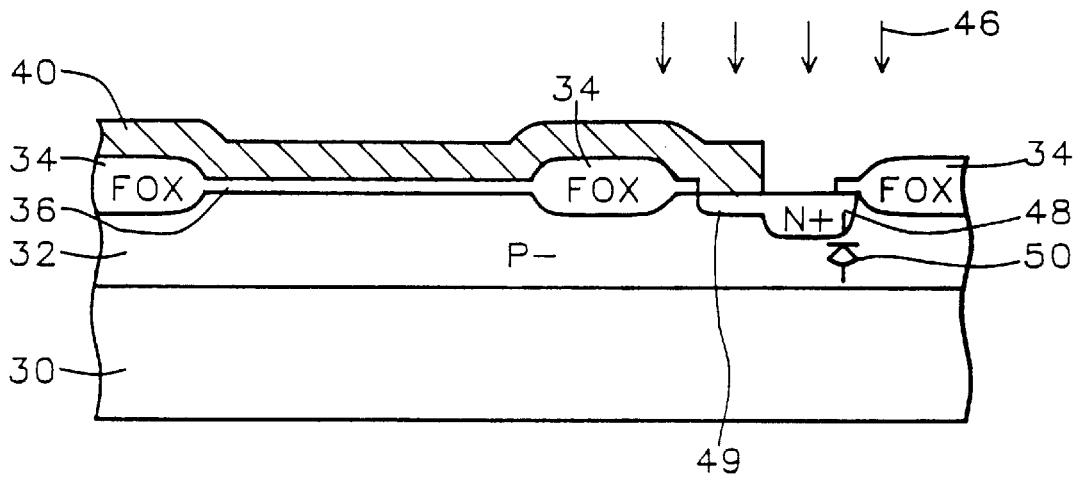

In a key step of the invention, referring now to FIG. 5, an ion implantation 46 is performed to form the buried contact of the invention. Arsenic is implanted at a concentration of between about 5 E 14 and 5 E 15 atoms/cm.$^2$ and an energy of between about 20 and 100 KeV to form N+ region 48 in the P-well 32. The active regions of MOS device 42 may be formed simultaneously with the arsenic implant.

During a subsequent drive-in of the dopant, region 49 is formed by outdiffusion from polysilicon 40, and connects to N+ region 48. The N+ region 48 is driven in by heating to a temperature of between about 800 and 850° C. for between about 10 and 30 minutes. A buried P/N contact is thus formed, as represented by diode 50, connected to polysilicon 40 and to substrate 30. By grounding the substrate, plasma processing steps that take place after formation of the FIG. 5 structure are prevented from causing charge accumulation at the gate oxide 36.

Figure 6:
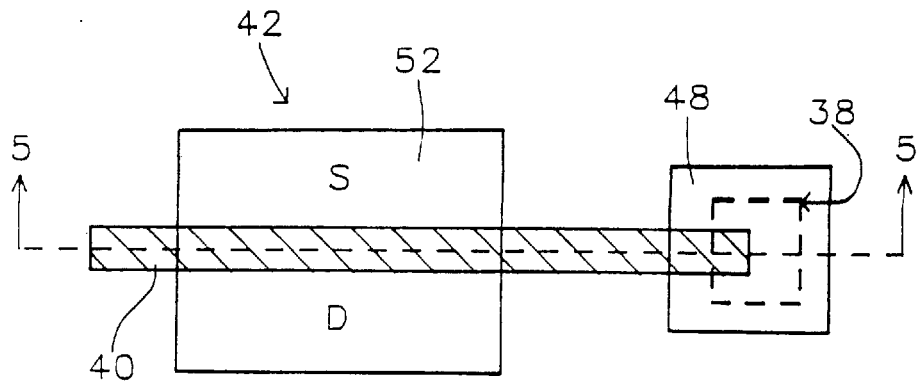
FIG. 6 is a top view of the FIG. 5 structure of the invention, where

A top view of the FIG. 5 cross-section is shown in FIG. 6, where FIG. 5 is taken along line 5—5. MOS device 42 is shown having diffusion region 52 with source S and drain D, and gate electrode 40 connected to the buried contact. The buried contact is shown having diffusion region 48 connected to poly 42 through contact 38.

Figure 7:
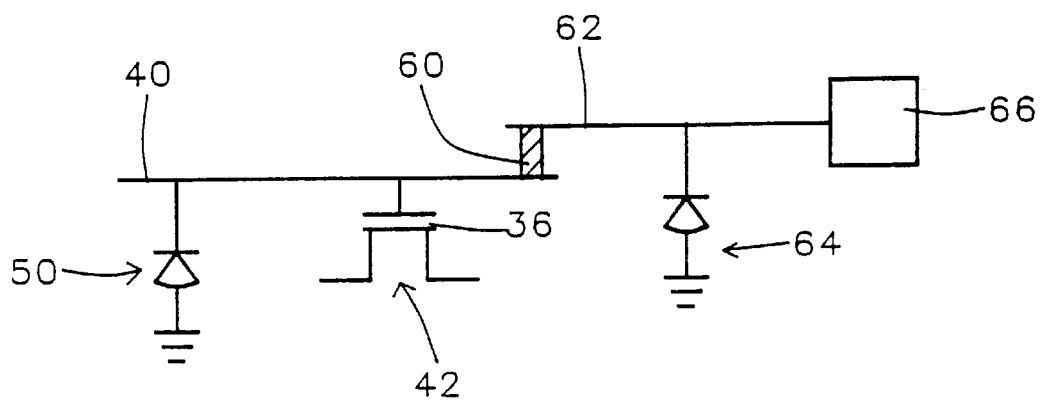
FIG. 7 is a schematic diagram of the resultant structure of the invention.

A schematic view of the invention is depicted in FIG. 7, showing buried contact 50 connected to poly 40, MOS device 42 having gate oxide 36. It can be seen that the buried contact provides protection to the gate oxide from plasma-induced charging defects before metallization. Processing would then continue to complete formation of the integrated circuit, including formation of metal contact 60, metal 62, second protection diode 64 and metal contact pad 66.

While the invention has been particularly shown and described with reference to the preferred embodiments thereof, it will be understood by those skilled in the art that various changes in form and details may be made without departing from the spirit and scope of the invention. For example, the invention could be used to connect a P+ polysilicon layer to a P+/N-well buried contact, or to a P+/N-substrate structure.

What is claimed is:

1. A method for plasma processing an integrated circuit formed on a semiconductor substrate having a polysilicon layer on its surfaces which is electrically connected to device structures, the method comprising the steps of:
   connecting the polysilicon layer directly to a buried contact in the semiconductor substrate;
   connecting the buried contact directly to a reference potential;
   after said connecting steps, placing the integrated circuit in a chamber for accomplishing the plasma process;
   after said placing, subjecting the integrated circuit to the plasma process whereby the connection to said buried contact prevents damage to the device structures;
   removing the integrated circuit from the chamber;
   after said subjecting step, forming one or more metal layers above and connected to said polysilicon layer; and
   after said forming step, subjecting the integrated circuit to further plasma processing whereby the connection to the buried contact prevents damage to said device structures.

2. The method of claim 1, wherein the buried contact and the polysilicon layer are doped to a first conductivity type and the semiconductor substrate is doped to a second conductivity type adjacent the buried contact so that the polysilicon layer is coupled to the semiconductor substrate through a diode.

3. The method of claim 2, wherein the first conductivity type is N-type and the second conductivity type is P-type.

4. The method of claim 1, wherein the polysilicon layer is patterned as a gate electrode and the polysilicon layer separated from the substrate by a gate oxide layer.

5. The method of claim 4, wherein the buried contact and the gate electrode are doped to a first conductivity type and the semiconductor substrate is doped to a second conductivity type adjacent the buried contact so that the gate electrode is coupled to the semiconductor substrate through a diode.

6. The method of claim 5, wherein the buried contact is connected through the substrate to the reference potential.

7. The method of claim 1, wherein the polysilicon layer is patterned as a gate electrode and the polysilicon layer separated from the substrate by a gate oxide layer, and wherein the buried contact and the gate electrode are doped to a first conductivity type and the semiconductor substrate is doped to a second conductivity type adjacent the buried contact so that the gate electrode is coupled to the semiconductor substrate through a diode.

8. The method of claim 7, wherein the metal layer is connected by metal interconnects to a second diode formed in the semiconductor substrate.

9. The method of claim 7, wherein the reference potential is ground.

10. A method of protecting against plasma charging damage, comprising:
    providing a semiconductor substrate having a field oxide layer and a thin gate oxide formed thereon;
    forming a buried contact opening in the thin gate oxide to expose a first part of the surface of the semiconductor substrate;
    forming a polysilicon gate on the field oxide layer and the thin gate oxide, while simultaneously forming an opening overlapping part of the buried contact opening to expose a second part of the surface of the semiconductor substrate;
    performing an ion implantation step on the second part of the surface of the semiconductor substrate to form a buried contact in the semiconductor substrate, wherein the polysilicon gate and the buried contact are directly connected;
    forming an outdiffusion region connecting the buried contact by outdiffusing dopant from the polysilicon gate, wherein the outdiffusion region and the buried contact are directly connected;
    connecting the buried contact to a reference potential;
    placing the integrated circuit in a chamber for accomplishing a plasma process;
    subjecting the integrated circuit to the plasma process whereby the connection to said buried contact prevents damage to device structures;
    removing the integrated circuit from the chamber;
    forming one or more metal layers above and connected to said polysilicon layer; and
    subjecting the integrated circuit to further plasma processing whereby the connection to the buried contact prevents damage to the device structures.

* * * * *